United States Patent
Lielens et al.

(10) Patent No.: US 10,460,046 B1
(45) Date of Patent: Oct. 29, 2019

(54) CONVECTED PERFECTLY MATCHED LAYERS

(71) Applicant: MSC Software Belgium SA, Mont-Saint-Guibert (BE)

(72) Inventors: Gregory Lielens, Céroux-Mousty (BE); Jean-Pierre Coyette, Chaumont-Gistoux (BE)

(73) Assignee: MSC SOFTWARE BELGIUM SA, Mont-Saint-Guibert (BE)

( * ) Notice: Subject to any disclaimer, the term of this patent is extended or adjusted under 35 U.S.C. 154(b) by 912 days.

(21) Appl. No.: 14/626,742

(22) Filed: Feb. 19, 2015

(51) Int. Cl.
*G06F 17/50* (2006.01)
*G06F 17/10* (2006.01)

(52) U.S. Cl.
CPC .......... *G06F 17/5009* (2013.01); *G06F 17/10* (2013.01); *G06F 17/50* (2013.01)

(58) Field of Classification Search
CPC .......... G06F 17/50; G06F 17/10; G06F 17/11; G06F 17/12; G06F 17/13; G06F 17/5009; G06F 17/5054; G06F 17/5059; G06F 17/5063
USPC ........................................................... 703/1
See application file for complete search history.

(56) References Cited

PUBLICATIONS

Tarinejad, R., and M. H. Ahmadi. "Dynamic Analysis of Dam-Reservoir System Using Adopted PML in the Radiation Boundary." Vibration Problems ICOVP 2011: the 10th International Conference on Vibration Problems. ICOVP 2011 Supplement, 2011. pp. 242-248.*

Berenger, Jean-Pierre. "A perfectly matched layer for the absorption of electromagnetic waves." Journal of computational physics 114.2 (1994). pp. 185-200.*

Casenave, Fabien, Alexandre Ern, and Guillaume Sylvand. "Coupled BEM-FEM for the convected Helmholtz equation with non-uniform flow in a bounded domain." Journal of Computational Physics 257 (2014). pp. 627-644.*

Drela, Mark. Flight vehicle aerodynamics. MIT Press, 2014. ISBN 978-0-262-52644-9. pp. 179-181.*

Zampolli, Mario, et al. "A computationally efficient finite element model with perfectly matched layers applied to scattering from axially symmetric objects." The Journal of the Acoustical Society of America 122.3 (2007). pp. 1472-1485.*

Tarinejad, R., and M. H. Ahmadi. "Dynamic Analysis of Dam-Reservoir System Using Adopted PML in the Radiation Boundary." Vibration Problems ICOVP 2011: the 10th International Conference on Vibration Problems. ICOVP 2011 Supplement, 2011. pp. 242-248. (Year: 2011).*

Bécache, Eliane, AS Bonnet-Ben Dhia, and Guillaume Legendre. "Perfectly matched layers for the convected Helmholtz equation." SIAM Journal on Numerical Analysis 42.1 (2004). pp. 409-433 (Year: 2004).*

(Continued)

*Primary Examiner* — Kamini S Shah
*Assistant Examiner* — John E Johansen
(74) *Attorney, Agent, or Firm* — Foley & Lardner LLP

(57) ABSTRACT

Systems, apparatuses, and methods are described relating to object modeling, including, but not limited to, providing a convected perfectly matched layer (PML) expression as boundary condition for at least a portion of a model. The convected PML expression defines the boundary condition of the portion of the model in any arbitrary direction, allowing automatic definition of the boundary condition. The convected PML expression defines the boundary condition of the portion of the model in a constant or non-constant mean flow context.

16 Claims, 8 Drawing Sheets

(56) References Cited

PUBLICATIONS

Casenave, Fabien, Alexandre Ern, and Guillaume Sylvand. "Coupled BEM-FEM for the convected Helmholtz equation with non-uniform flow in a bounded domain." Journal of Computational Physics 257 (2014). pp. 627-644. (Year: 2014).*
Drela, Mark. Flight vehicle aerodynamics. MIT Press, 2014. ISBN 978-0-262-52644-9. pp. 179-181. (Year: 2014).*
Zampolli, Mario, et al. "A computationally efficient finite element model with perfectly matched layers applied to scattering from axially symmetric objects." The Journal of the Acoustical Society of America 122.3 (2007). pp. 1472-1485. (Year: 2007).*
Landy, N. et al. "Perfect metamaterial absorber." Physical review letters 100.20 (2008). pp. 207402-1-207402-4. (Year: 2008).*

* cited by examiner

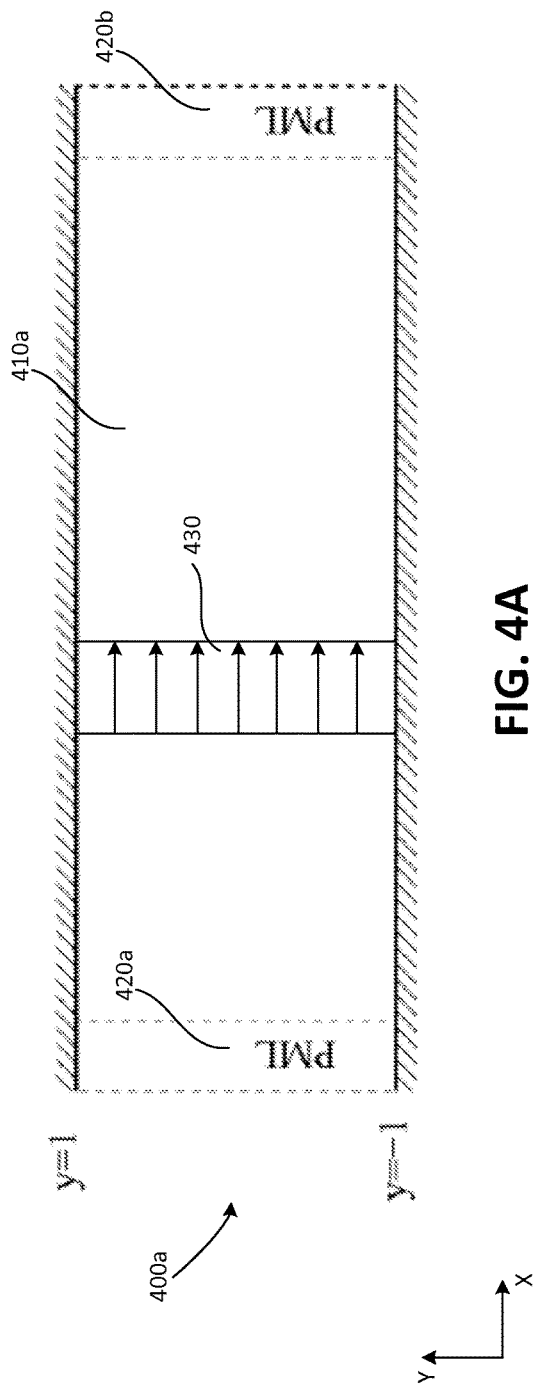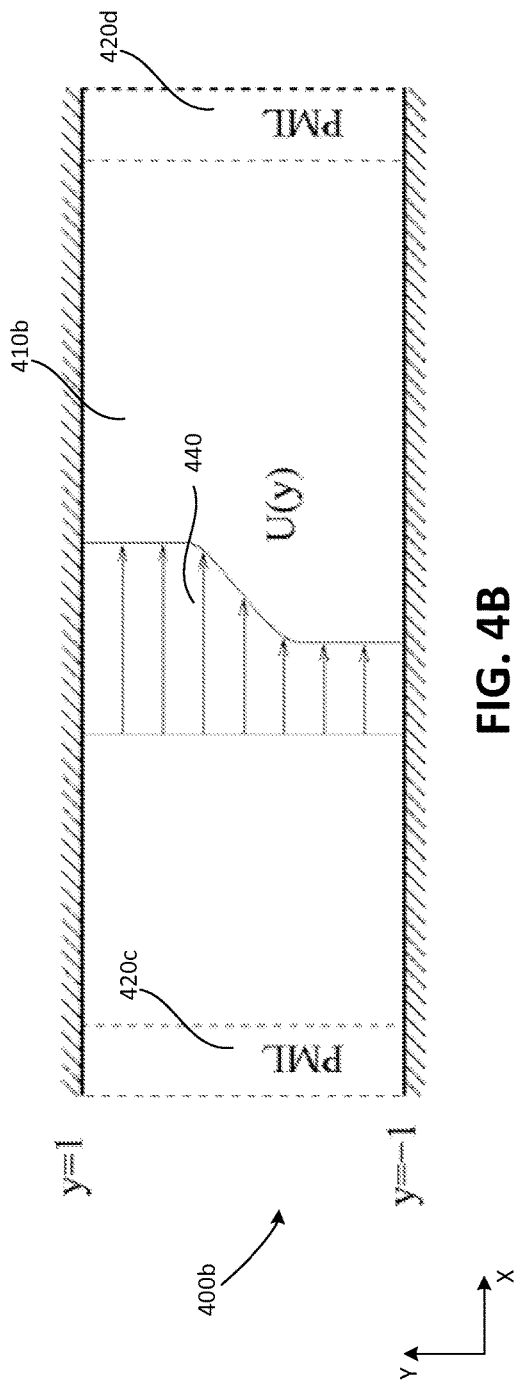
FIG. 4A
FIG. 4B

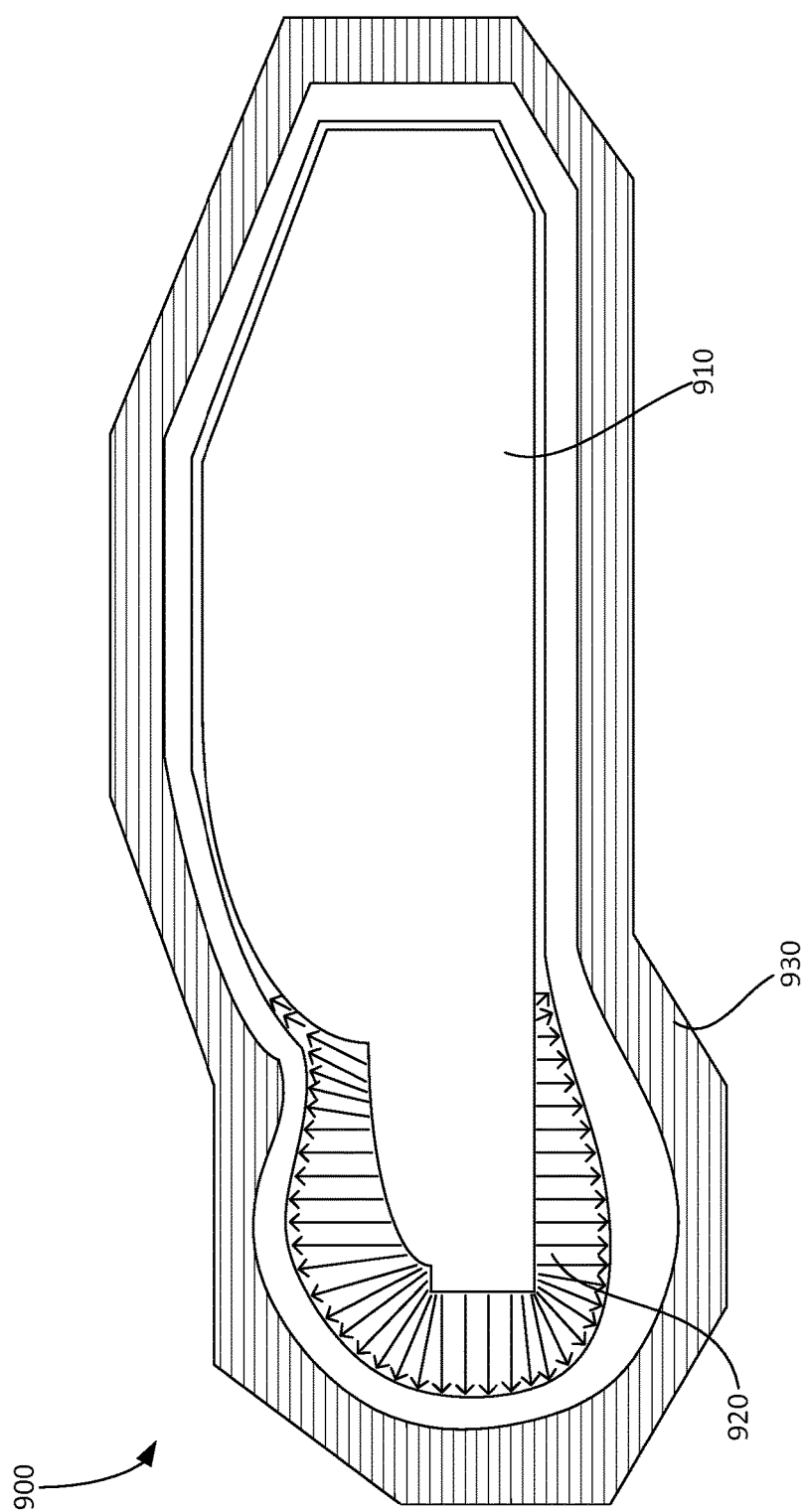

CONVECTED PERFECTLY MATCHED LAYERS

BACKGROUND OF THE INVENTION

Providing an efficient absorbing layer/boundary condition for numerical simulation involving radiation in an infinite or semi-infinite medium has always been a recurring issue to be solved in the field of simulation. Solutions to this issue are known as non-reflective boundary conditions (NRBC). A perfectly matched layer (PML) is one of the NRBC techniques currently used, and is quite extensively used in modeling wave propagation.

A PML may be a special physical domain (e.g., an absorbing layer) surrounding a near-field computational domain. The PML may be implemented in various computer-aided design (CAD) simulations as a NRBC for different wave expressions such as, but not limited to, sound waves (acoustics), elastic waves, or electromagnetic waves. In particular, the PML may be used for volume partition approaches such as finite elements, finite volumes, finite differences, and the like to approximate an infinite or semi-infinite wave propagation domain.

Multiple barriers in implementing PML include limiting the amount of additional degrees of freedom, limiting choice for selecting stretching directions, difficult automatic definition, and the like. Typically PML is an efficient method (in terms of CPU cost and memory for a given accuracy of the near field) when the PML includes few computational degrees of freedom. Few computational degrees of freedom may refer to, for example, few nodes in a finite difference or finite element context. PML coordinate-stretching may be limited to constant stretching aligned with a coordinate axis. The limited coordinate-stretching may limit shapes associated with boundary conditions to boxes (cartesian coordinates), cylinders (cylindrical coordinates), or spheres (spherical coordinates). Therefore, a large number of parameters and geometry of the boundary conditions must be defined for PML, rendering it un-user-friendly and complicated to implement. This also detracts from PML's efficiency, because regular shapes often have to be large to surround irregular radiating bodies, increasing the total number of degrees of freedom required.

SUMMARY OF THE INVENTION

Embodiments described herein relate to a non-reflective boundary conditions (NRBC) in the context of convected acoustic waves. In particular, described herein are systems and methods for efficient absorption of incoming acoustic waves using a convected perfectly matched layer (PML) expression. The convected PML expression is obtained without any special requirement on the absorbing layer geometry or mean flow field. The convected PML expression defines the boundary condition of a portion of a model in any arbitrary direction, allowing automatic definition of the boundary condition. The convected PML expression defines the boundary condition of the portion of the model in a constant or non-constant mean flow context.

In summary, the convected PML expression may be associated with similar advantages to existing at-rest PML expression, while not incurring additional limitation. In particular, automatic definition procedures and mesh adaptability for multi-frequency simulation may be available using the convected PML expression. The convected PML expression may also take into account far-field convective effects. Accordingly, the convected PML expression may be a suitable alternative (or replacement) to infinite element (IE) approaches in defining boundary condition. By way of illustrating with a non-limiting example, the convected PML expression techniques may be more processor-efficient than the IE techniques for high-frequency aircraft engine radiation. This is so despite the additional cost of far-field integration methods for retrieving far-field results.

Systems and methods are described herein relating to defining a boundary condition of a portion of a model using the convected PML expression. A method is described, including, but not limited to, providing a model of a physical object; providing a convected PML expression as boundary condition for at least a portion of the model; and at least one of: displaying, with a user interface, the model to a user; and simulating, with the processor, the model.

In some embodiments, the model is a computer-aided design (CAD) model.

In various embodiments, the portion of the model is an absorbing region.

According to some embodiments, providing the PML in the convected PML expression includes: transforming a convected Helmholtz expression in the absorbing region into an at-rest Helmholtz expression for the absorbing region; transforming the at-rest Helmholtz expression into a modified PML expression; and transforming the modified PML expression in into the convected PML expression for the absorbing region.

In various embodiments, the convected Helmholtz expression is transformed into the at-rest Helmholtz expression using a bijective transformation.

In some embodiments, transforming the convected Helmholtz expression into the at-rest Helmholtz expression includes applying Prandtl-Glauert (P-G) transformation to the convected Helmholtz expression for the absorbing region.

In some embodiments, the convected Helmholtz expression is a first expression for a constant mean flow; the at-rest Helmholtz expression is a second expression for a classic fluid at-rest; and transforming the convected Helmholtz expression into the at-rest Helmholtz expression includes transforming the first expression into the second expression using P-G transformation.

According to some embodiments, transforming the at-rest Helmholtz expression into the PML expression includes applying PML coordinate stretching to the at-rest Helmholtz expression for the absorbing region.

In some embodiments, transforming the at-rest PML expression into the convected PML expression includes applying reverse P-G transformation to at-rest PML expression for the boundary condition.

In some embodiments, the method further includes simulating the model based, at least in part, on the convected PML expression for the boundary condition for the at least a portion of the model.

In various embodiments, providing the convected PML expression includes defining at least one stretching direction for the convected PML expression; and the at least one stretching direction includes at least one of a coordinate axial direction and an arbitrary direction other than coordinate axial direction. The stretching direction may be defined independently from the coordinate system and independently from the mean flow direction.

In some embodiments, providing the convected PML expression includes defining the convected PML expression for a constant mean flow.

In various embodiments, providing the convected PML expression includes defining the convected PML expression for a non-constant mean flow.

In some embodiments, a system is described, the system includes a processor that executes a boundary condition generation module configured to: provide a model of a physical object; and provide a convected PML expression as boundary condition for at least a portion of the model; and at least one of a user interface configured to display the model to a user; and the processor that executes a simulation module configured to simulate the model.

In various embodiments, the portion of the model is an absorbing region; to provide the PML in the convected PML expression includes: to transform a convected Helmholtz expression in the absorbing region into an at-rest Helmholtz expression for the absorbing region; to transform the at-rest Helmholtz expression into a modified PML expression; and to transform the modified PML expression in into the convected PML expression for the absorbing region.

In some embodiments, to provide the convected PML expression includes to define at least one stretching direction for the convected PML expression; and the at least one stretching direction including at least one of a coordinate axial direction and an arbitrary direction other than coordinate axial direction. The stretching direction may vary in space and not necessarily aligned with the coordinate axes.

According to some embodiments, to provide the convected PML expression includes to define the convected PML expression for a non-constant mean flow.

Various embodiments describe a non-transitory processor readable storage media storing a program that when executed in a processor of a device causes the processor to perform a method, the method including: providing a model of a physical object; and providing a convected PML expression as boundary condition for at least a portion of the model.

In some embodiments, the portion of the model is an absorbing region. Providing the PML in the convected PML expression includes: transforming a convected Helmholtz expression in the absorbing region into an at-rest Helmholtz expression for the absorbing region; transforming the at-rest Helmholtz expression into a modified PML expression; and transforming the modified PML expression into the convected PML expression for the absorbing region.

In various embodiments, providing the convected PML expression includes defining the convected PML expression for a non-constant mean flow. In various embodiments, providing the convected PML expression includes defining the convected PML expression for a non-constant mean flow and non-constant stretching direction. The mean flow direction and stretching direction may or may not be aligned.

BRIEF DESCRIPTION OF THE DRAWINGS

The disclosure will become more fully understood from the following detailed description, taken in conjunction with the accompanying figures, wherein like reference numerals refer to like elements, in which:

FIG. 4A is a schematic diagram illustrating an example of a third model having a constant flow 430 according to various embodiments.

FIG. 4B is a schematic diagram illustrating an example of a fourth model having a non-constant flow 440 according to various embodiments.

FIG. 9 is a schematic diagram illustrating an example of a fifth model according to various embodiments.

DETAILED DESCRIPTION OF THE PREFERRED EMBODIMENTS

Figure 1:
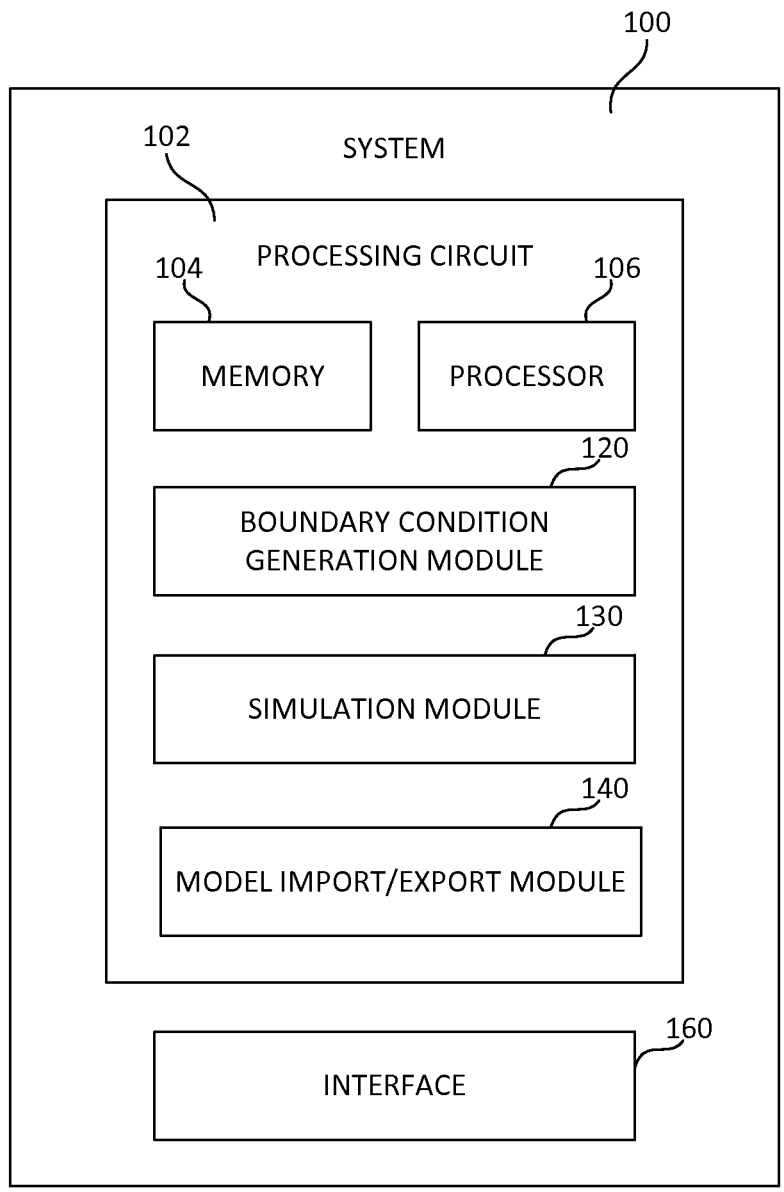
FIG. 1 is a block diagram illustrating an example of a boundary condition generation module as implemented in a system according to various embodiments.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Referring generally to the figures, the implementations described herein relate to providing a boundary condition management tool for generating and editing a model. The boundary condition management tool may be embodied in a boundary condition generation module. As referred to herein, a model may include a finite element (FE) model, computer aided design (CAD), computer aided engineering (CAE), and/or the like. In particular, the boundary condition generation module may provide boundary condition for portions of the model. Systems including the boundary condition generation module may link the features described herein to manufacturing process. For example, models simulated and validated with aide of the boundary condition generation module may be manufactured or otherwise produced in any suitable process in real-time or at a subsequent time. In other embodiments, the boundary condition generation module may provide an output to any simulation software.

In particular, embodiments described herein extends perfectly matched layer (PML) to convected waves (e.g., acoustics, elasticity, electromagnetism, and the like) while keeping appropriate absorption performance of PML techniques when applied to, for example, waves propagating in a medium at rest. In general terms, embodiments use a form of convected Helmholtz expression to compute wave propagation of pressure fluctuation into a fluid in motion (i.e. in presence of mean flow). The convected Helmholtz expression may include a mean flow times pressure gradient term. The mean flow times pressure gradient term may be responsible for taking into account the non-symmetry of the wave propagation, as wavelength being compressed when the wave propagation is against the flow and stretched when wave propagation is along the flow.

A system may include a processing circuit supporting at least a boundary condition generation module. The simulation system may receive (via an interface that receives input from a user) data related to a model (e.g., a CAD model) of a physical object. Alternatively, data related to the model (or a portion thereof) may be retrieved from local or remote memory storage. As such, the model may be provided to the boundary condition generation module for generating boundary condition for at least a part of the model. In particular embodiments, the boundary condition may refer to implementing a convected PML expression.

The convected PML expression may be generated in three general steps: 1) transforming a convected Helmholtz expression of the boundary condition into an at-rest Helmholtz expression in the absorbing region; 2) transforming the at-rest Helmholtz expression of the boundary condition into a PML expression in the absorbing region; and 3) transforming the at-rest PML expression of the boundary condition into the convected PML expression in the absorbing region. Alternatively, the three steps may be applied virtually, leading to a final convected PML expression that may be directly applied as an NRBC by the boundary condition generation module in one step.

The convected Helmholtz expression may be initially applied (e.g., by the boundary condition generation module) as the boundary condition. In some embodiments, the convected Helmholtz expression may be an expression for a constant mean flow expression in a first (original) space. The at-rest Helmholtz expression of the boundary condition may be an expression for a classic Helmholtz expression (e.g., for an acoustic fluid at-rest). Transforming the convected Helmholtz expression into the at-rest Helmholtz expression of the boundary condition may involve applying the Prandtl-Glauert (P-G) transformation to transform the convected Helmholtz expression from the first space into a second space (e.g., the P-G space). In some embodiments, the P-G transformation consists in a coordinate stretching along the flow and a phase-shift change of variable.

Next, PML coordinate stretching may be applied (e.g., by the boundary condition generation module) for transforming the at-rest Helmholtz expression of the boundary condition into the PML expression able to absorb incoming waves. By way of illustrating with a non-limiting example involving acoustics, a modified Helmholtz expression with complex speed of sound and complex, anisotropic second order density tensor may be obtained as a result of the PML coordinate stretching.

Next, the boundary condition generation module may transform the at-rest PML expression into the convected PML expression. Given that the P-G transformation may be a bijective transformation, the reverse P-G transformation may be used to transform the at-rest PML expression back into a convected PML expression, for example, from the second space back to the first space. As illustrated in a non-limiting example, a PML convected Helmholtz expression (i.e., convected PML expression) in the original space (without any change of variable) may be obtained. In particular embodiments involving acoustics, the speed of sound, density and convection mean flow of this expression may be linked to the equivalent properties of the original convected Helmholtz equation, but modified in a complex way by the PML coordinate stretching. For example, density, which was a real scalar, may become a complex second order tensor, whose value is an algebraic function of the mean flow vector and the PML stretching direction.

Advantages associated with the PML expression in the convected Helmholtz form may include validity for arbitrary mean flow and PML stretching direction, independent of each other and not limited to coordinate axes. Thus, user-friendliness may be improved as an automatic PML definition is possible.

FIG. 1 is a block diagram illustrating an example of a boundary condition generation module 120 as implemented in a system 100 according to various embodiments. The system 100 may include a processing circuit 102 and an interface 160. The processing circuit 102 may be part of a workstation computer or other suitable types of computing device. The processing circuit 102 may include various modules for executing various functions described herein. The processing circuit 102 may include memory 104, a processor 106, the boundary condition generation module 120, a simulation module 130, a model import/export module 140, and/or the like. The system 100 may include other devices such as a network system, wireless or wired communications systems, printers, and/or the like for performing common functions associated therewith.

The processor 106 may be configured to be coupled to the boundary condition generation module 120 to execute the functionalities and features of the boundary condition generation module 120 described herein. The processor 106 may receive instructions from the interface 160 corresponding to user input. The processor 106 may also be coupled to the simulation module 130 and the model import/export module 140 for performing functions described herein. For example, the processor 106 may receive a model of a physical object, determining a suitable boundary condition for at least a portion of the model, applying the boundary condition, performing simulations or consistency checks, a combination thereof, and/or the like. In particular, the boundary condition may be a convected PML expression.

The processor 106 may include any suitable data processing device, such as a general-purpose processor (e.g., a microprocessor), but in the alternative, the processor 106 may be any conventional processor, controller, microcontroller, or state machine. The processor 106 may also be implemented as a combination of computing devices, e.g., a combination of a DSP and a microprocessor, a plurality of microprocessors, at least one microprocessor in conjunction with a DSP core, or any other such configuration. For example, the processor 106 may be, but is not limited to being, an Intel® designed processor, AMD® designed processor, Apple® designed processor, QUALCOMM® designed processor, or ARM® designed process.

The memory 104 (or storage device) may be operatively coupled to the processor 106 and may include any suitable device for storing software instructions and data for controlling and use by the processor 106 to perform operations and functions described herein, including, but not limited to, random access memory RAM, read only memory ROM, floppy disks, hard disks, dongles or other RSB connected memory devices, or the like. The memory 104 may include non-transitory storage media that is configured to store information regarding a geometric model that is being currently modified or was created in the past and/or computer readable instructions for the processes performed by the processor as described.

The memory 104 may send or receive data to or from the processor 106 and each of the modules/components in the system 100. In some embodiments, the memory 104 may be a remote storage device that stores data for the system 100 (or only the processing circuit 102) in a different node within a network from at least one module (e.g., the interface 160, the boundary condition generation module 120, the simulation module 130, the model import/export module 140, a combination thereof, or the like) of the system 100. In other embodiments, the memory 104 may be located on the same computer system (e.g., within the same node of the network) as the interface 160, the boundary condition generation module 120, the simulation module 130, the model import/export module 140, a combination thereof, or the like. In various embodiments, the memory 104 may include various databases as described.

In various embodiments, the boundary condition generation module 120 may be configured to execute the methods described herein with respect to boundary condition generation, application, and management. The boundary condition generation module 120 may be a computer system in communication with processor 106, memory 104, simulation module 130, model import/export module 140, interface 160, and/or the like. In some implementations, (instructions for) the boundary condition generation module 120 may be stored on a non-transitory storage medium, which may be, in some cases the memory 104. The boundary condition generation module 120 may be located in a same or different network node from the interface 160. For example, the boundary condition generation module 120 may communicate with the interface 160 through a (wired or wireless) network. Accordingly, boundary condition generation module 120 may be a cloud-based system that provides software as a service.

The model import/export module 140 may include a model and part database (not shown). The model and part database may be any non-transitory storage medium (e.g., the memory 104) configured to store at least one model (or at least a part thereof) representing the physical object. The model and part database may store various attributes for the model and part. The attributes may include, but are not limited to, the geometry and dimensions (e.g., length, width, height, radius, and the like). The attributes may also include other characteristics, including, but not limited to, material characteristics (e.g., flexibility, durability, material composition, color), node positions for snapping/grabbing, and the like.

In some embodiments, the attribute values (e.g., for sets of attributes) may be predefined for a model/part stored within the model and part database. In other embodiments, the attribute values may be imported from a virtualization process (e.g., from a representation import/export module, which is not shown). User-defined attributes or attribute values may be stored in the model and part database during the designing and/or the modification processes. Based on the data stored in the model and part database, the interface 160 may display graphical representations of the model and/or at least a part thereof.

In some embodiments, the model import/export module 140 may be configured to import model data of the physical object to various components in the processing circuit 102. In some embodiments, the model import/export module 140 may import virtualized model data or user-designed model data (through the interface 160) corresponding to the physical objects. Model data imported by the model import/export module 140 may be stored within the memory 104 and/or suitable databases. The model import/export module 140 may send model information to the interface 160 for graphically displaying the model. Additionally, the model import/export module 140 may export the model and/or part data to a separate module (e.g., the boundary condition generation module 120 or the like) within the system 100. The representation import/export module 140 may export the simulation module 130 for object model-based simulation. The representation import/export module 140 may be coupled to the processor 106 and the memory 104 to execute the features described herein.

The simulation module 130 may perform simulations based on the models (or parts thereof). In particular, the simulation module 130 may perform simulations as well as other processes based, at least in part, on the boundary conditions (generated and applied by the boundary condition generation module 120) and other parts of the model. The simulation module 130 may be coupled to the processor 106 and the memory 104 to execute the features described herein. The simulation module 130 may be connected or otherwise linked to the interface 160. Accordingly, the simulation module 130 may receive user input as to simulation parameters and instructions via the interface 160 and display simulation processes or results to the user based on the user input.

In some embodiments, the interface 160 may include at least one input device for receiving input from a user and at least one display one device for relaying information to the user. For example, the input device may include a computer with a monitor, keyboard, keypad, mouse, joystick, touch screen display, or other input devices performing a similar function. The input device may include a keyboard including alphanumeric and other keys, and may be connected to processing circuit 102 (e.g., the processor 106 and the memory 104) for communicating information and command selections. The input device may include a touch screen interface or movement sensing interface that may be combined with, or separated from, the display device of the interface 160. The input device may include a cursor control device, such as, but not limited to, a mouse, trackball, touch screen, motion sensor, cursor direction keys, and the like. Such input device may control cursor movement on the display device. The display device of the interface 160 may be any type of display (e.g., CRT display, LCD display, etc.) configured to provide audio and/or visual output to the user of the system 100.

Figure 2:
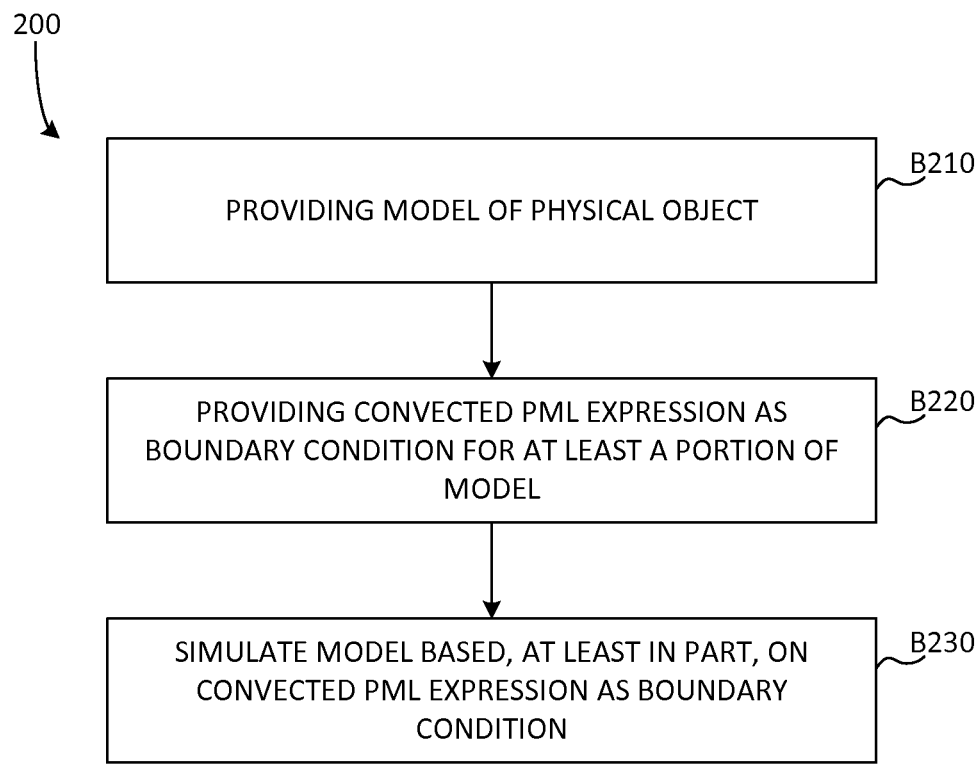
FIG. 2 is a process flowchart diagram illustrating an example of a boundary condition determination process according to various embodiments.

FIG. 2 is a process flowchart diagram illustrating an example of a boundary condition determination process 200 according to various embodiments. Referring to FIGS. 1-2, the boundary condition determination process 200 may be implemented with a system such as, but not limited to, the system 100.

First at block B210, the model import/export module 140 may provide a model of a physical object. The model may be any suitable model including, but not limited to, a CAD model, CAE model, FE model, a combination thereof, and/or the like. The model may include at least one component (e.g., part). In some embodiments, the model import/export module 140 may import model data (e.g., model attributes) from a database (e.g., the memory 104) or a virtualization process. In other embodiments, the model import/export module 140 may accept user input (via the interface 160) regarding at least one attribute of the physical object to generate the model.

In some embodiments, the model import/export module 140 may relay the model data to the boundary condition generation module 120 (for storing and processing locally by the boundary condition generation module 120). In other embodiments, the model import/export module 140 may store the model data in the memory 104 (or other suitable database) to be accessed by the boundary condition generation module 120.

Next at block B220, the boundary condition generation module 120 may provide a convected PML expression as boundary condition for at least a portion of the model. The portion of the model may correspond to a component (or a part thereof) of the model. The component (or the part thereof) may be defined as the portion for implementing the boundary condition. In some embodiments, the convected PML expression may be an improved PML Helmholtz expression.

Specifically, the boundary condition generation module 120 may determine geometry of the convected PML expression based on various attributes of the portion of the model and/or user input. For example, the boundary condition based on the convected PML expression may be an outer layer surrounding the portion of the model. A size or thickness of the boundary condition based on the convected PML expression may be determined based on the geometry of the portion as well as the frequency, among other parameters.

The boundary condition generation module 120 may define the convected PML expression for the portion of the model in any arbitrary direction set by the user (e.g., via the interface 160) or automatically as determined by the boundary condition generation module 120. For example, the boundary condition of the portion of the model in the convected PML expression may be stretched (e.g., in coordinate stretching) in coordinate axial directions as well as any arbitrary directions.

In addition, expressing the portion of the model in the convected PML expression allows boundary conditions to be set for an arbitrary mean flow. That is, instead of being valid for only constant mean flow, the convected PML expression may be implemented in conditions where the mean flow is non-constant. When simulated (e.g., by the simulation module 130), no degradation of absorbing performance may be shown when the mean flow is set to be non-constant. The flow may be lead to downstream, upstream, propagating, evanescent propagation, and/or the like.

Next at block B230, the simulation module 130 may simulate the model based, at least in part, on the convected PML expression as the boundary condition for the at least the portion of the model. In particular, the convected PML expression may absorb incoming acoustic waves with respect to the portion for which the convected PML expression may be determined for. The simulation may be performed at near field points under a set of frequencies. Far-field simulations may also be performed, for example, using far field integration methods (e.g., FWH operators). In some embodiments, the entire model may be simulated. In such cases, the convected PML expression may be one of a plurality of aspects of the simulations. In other embodiments, some but not all parts of the model (including the portion for which the convected PML expression is defined for) may be simulated. In typical embodiments, the simulation module 130 may include a simulation chain configured for flow field computation and acoustic radiation. Alternatively and/or in addition to the simulation step set forth with respect to block B230, the model may be displayed, via the interface 160, to the user or manual inspection, simulation, modification, and/or the like. The results of any simulation may be displayed via the interface 160 to the user.

Figure 3B:
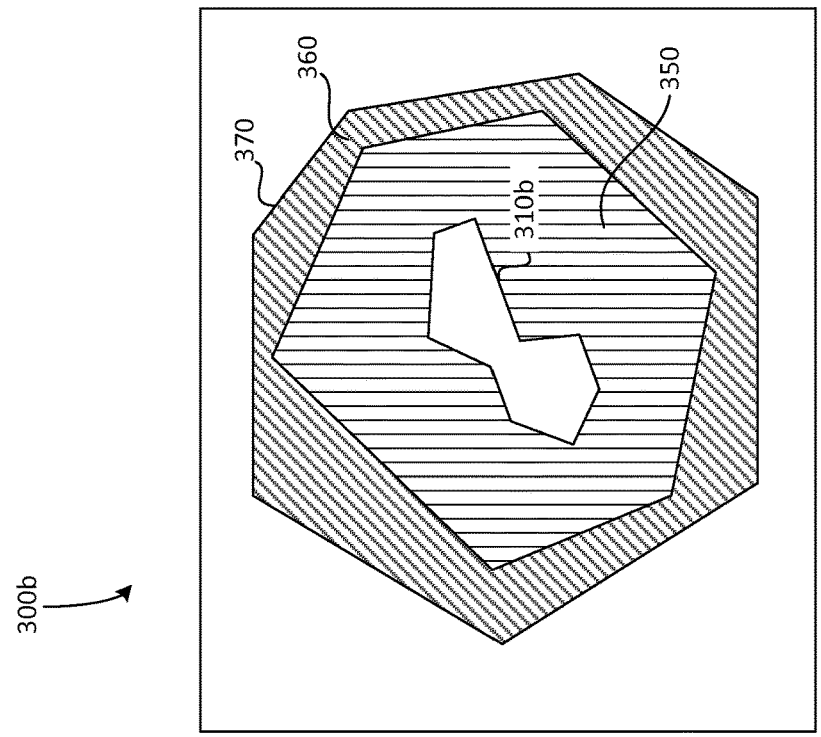
FIG. 3B is a schematic diagram illustrating an example of a second model according to various embodiments.
Figure 3A:
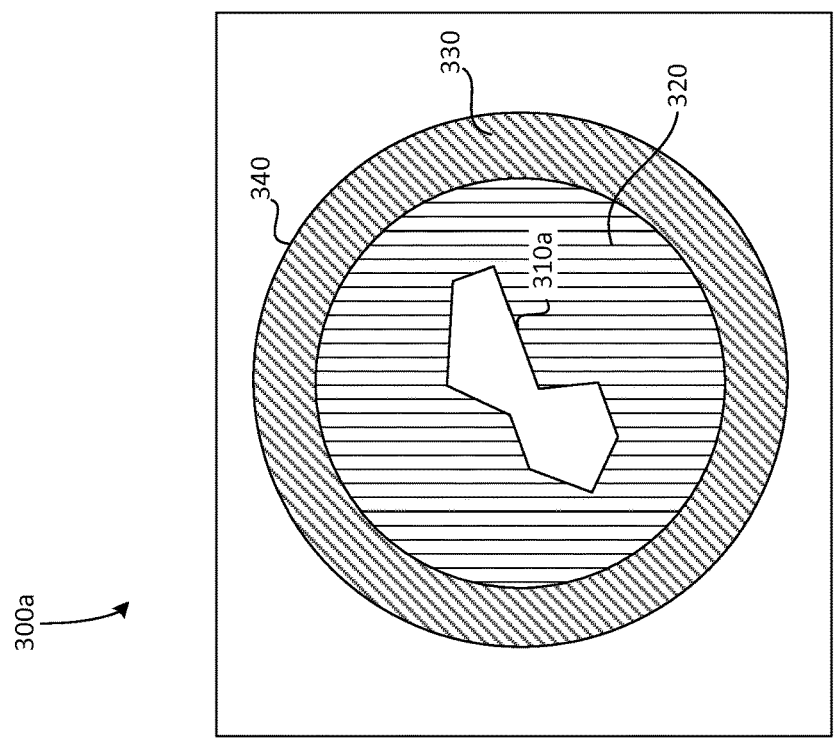
FIG. 3A is a schematic diagram illustrating an example of a first model according to various embodiments.

FIG. 3A is a schematic diagram illustrating an example of a first model 300a according to various embodiments. Referring to FIGS. 1-3A, the first model 300a may be at least a portion of a model described herein. The first model 300a may include a first vibrating component 310a, first acoustic component 320, first PML component 330, and first non-reflecting surface 340. The first acoustic component 320 may be associated with sources density. The first acoustic component 320 may exhibit a disk-like geometry.

The first PML component 330 and the first non-reflecting surface 340 may be defined based on the geometry of the first acoustic component 320 and/or stretching directions. In particular, the first PML component 330 may be defined (e.g., stretched) along coordinate axial directions. As shown in the non-limiting example of FIG. 3A, the first PML component 330 may be stretched along an angular axis.

FIG. 3B is a schematic diagram illustrating an example of a second model 300b according to various embodiments. Referring to FIGS. 1-3B, the second model 300b may be at least a portion of the model described herein. The second model 300b may include a second vibrating component 310b, second acoustic component 350, second PML component 360, and second non-reflecting surface 370. The second acoustic component 350 may be associated with sources density. The second acoustic component 350 may exhibit an arbitrary geometry.

The second PML component 360 and the second non-reflecting surface 370 may be defined based on the geometry of the second acoustic component 350 and/or stretching directions. In particular, the second PML component 360 may be defined (e.g., stretched) along arbitrary directions. As shown in the non-limiting example of FIG. 3B, the second PML component 360 may be stretched along multiple arbitrary directions. Thus, the second PML component 360 may not be limited to stretching along coordinate axes. Accordingly, flexibility may be achieved by enabling the second PML component 360 to be stretched in arbitrary directions, allowing automatic definition and definition based on user input of the second PML component 360.

Each of the first PML component 330 and the second PML component 360 may be a boundary condition component expressed in the convected PML expression. In providing the convected PML expression as the boundary condition for at least the portion of the model (e.g., as set forth with respect to block B220), the convected PML expression allows the boundary condition (e.g., a PML component such as the first PML component 330, the second PML component 360, and the like) along coordinate axes (as illustrated in FIG. 3A) as well as along arbitrary directions other than the coordinate axes (as illustrated in FIG. 3B).

FIG. 4A is a schematic diagram illustrating an example of a third model 400a having a constant flow 430 according to various embodiments. Referring to FIGS. 1-4A, the third model 400a may be at least a portion of a model described herein. In particular, the third model 400a may be a 2-dimensional representation of a cross-section of a tube, among other potential objects. The width of the structure defined by the third model 400a may be characterized as between a y=1 and y=−1. The third model 400a may include a first acoustic medium 410a having the constant flow 430 and first PML elements 420a, 420b. The constant flow 430 may be characterized by a flow parameter M (as the Mach number). The constant flow 430 may be along x-direction.

Each of the first PML elements 420a, 420b may be provided at either end of the third model 400a as absorbing layers. In various embodiments described herein, the convected PML expression (e.g., used to express the first PML elements 420a, 420b) may be used to define boundary conditions in a constant mean flow context. In the non-limiting example as illustrated in FIG. 4A, the constant mean flow context may refer to the constant flow 430 (i.e., M) present in the first acoustic medium 410a.

FIG. 4B is a schematic diagram illustrating an example of a fourth model 400b having a non-constant flow 440 according to various embodiments. Referring to FIGS. 1-4B, the fourth model 400b may be at least a portion of a model described herein. In particular, the fourth model 400b may be a 2-dimensional representation of a cross-section of a tube, among others. The width of the structure defined by the fourth model 400b may be characterized as between a y=1 and y=−1. The fourth model 400b may include a second acoustic medium 410b having the non-constant flow 440 and second PML elements 420c, 420d. The non-constant flow 440 may be characterized by a function U. In the non-limiting example illustrated in FIG. 4B, the function U (e.g., U(y)) may be varied based on y-coordinate values. In other examples, the non-constant flow 440 may be based on other variables or parameters. The non-constant flow 440 may be in the x-direction.

Each of the second PML elements 420c, 420d may be provided at either end of the fourth model 400b as absorbing layers. In various embodiments described herein, the convected PML expression (e.g., used to express the second PML elements 420c, 420d) may be used to define boundary conditions in a non-constant mean flow context. In the non-limiting example as illustrated in FIG. 4A, the non-constant mean flow context may refer to the non-constant flow 440 (i.e., U(y)) present in the second acoustic medium 410b.

Each of the first PML elements 420a, 420b and the second PML elements 420c, 420d may be a boundary condition component expressed in the convected PML expression. In providing the convected PML expression as the boundary condition for at least the portion of the model (e.g., as set forth with respect to block B220), the convected PML expression may allow the boundary condition (e.g., a PML component such as the first PML elements 420a, 420b, the second PML elements 420a, 420d, and the like) in a constant mean flow context (as illustrated in FIG. 4A) as well as in a non-constant mean flow context (as illustrated in FIG. 4B).

Figure 5:
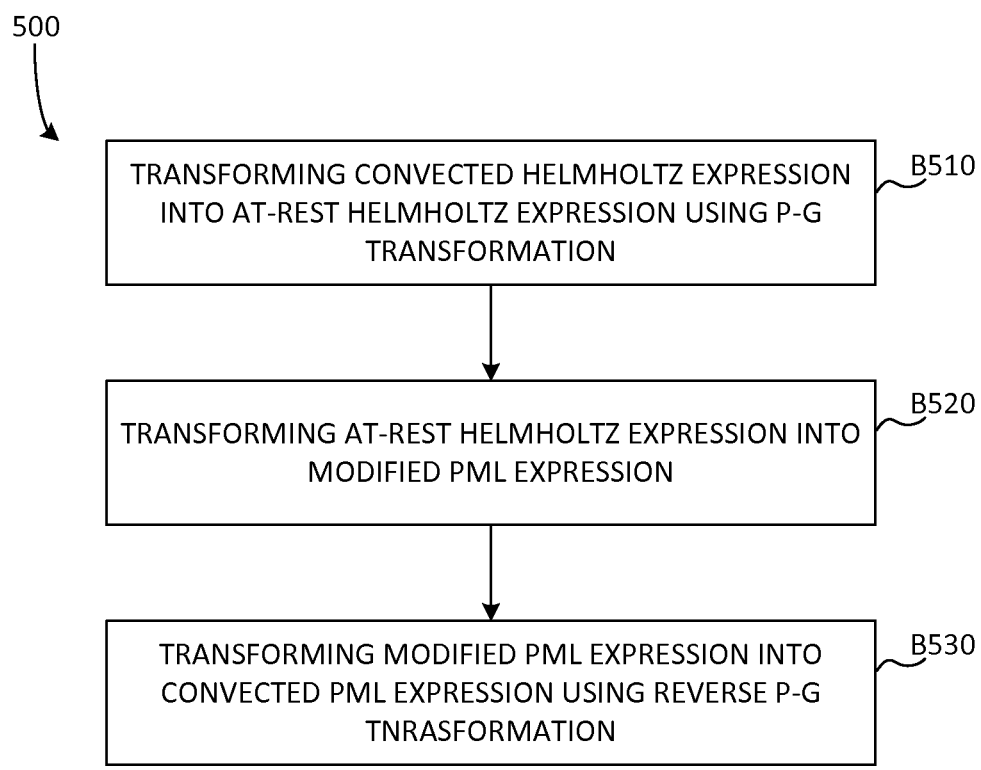
FIG. 5 is a process flowchart diagram illustrating an example of a convected PML generation process according to various embodiments.

FIG. 5 is a process flowchart diagram illustrating an example of a convected PML generation process 500 according to various embodiments. Referring to FIGS. 1-5, the convected PML generation process 500 may be used to generate a convected PML expression for a boundary condition corresponding to a portion of a model. In particular, the convected PML expression may be implemented in any arbitrary stretching direction and in a constant or non-constant mean flow context.

The convected PML expression extends PML techniques to convected acoustics and maintaining efficient absorption performance as applied to acoustic fluids at rest. The convected PML expression computes acoustic propagation of pressure fluctuation into an acoustic fluid in motion (i.e., in the presence of a mean flow). The convected PML includes a mean flow times pressure gradient to take into account non-symmetric propagation, when acoustic wavelength is being compressed as the wave propagation is against the flow and stretched when propagation is along the flow.

First at block B510, the boundary condition generation module 120 may transform a convected Helmholtz expression into an at-rest Helmholtz expression using the P-G transformation. In some embodiments, the convected Helmholtz expression may be an expression for boundary condition (of a portion of a model) in a constant mean flow context in a real space. The at-rest Helmholtz expression may be an expression for boundary condition (of a portion of a model) in a classical (acoustic fluid at rest) space. The P-G transformation may transform an expression (e.g., the convected Helmholtz expression) from a real space into a P-G space (in which the at-rest Helmholtz expression is defined). The P-G transformation may be a bijective transformation, which allow the reverse P-G transformation to transform the expression from the P-G classical space back to the real space (e.g., at block B530).

An example of a convected Helmholtz operator for the expression may be, for example:

$$j\omega\kappa(j\omega\phi+v\cdot\nabla\phi)+\nabla\cdot(\kappa v(j\omega\phi+v\cdot\nabla\phi)-\kappa c^2\nabla\phi)=0 \quad (1)$$

where $\omega$ is pulsation (i.e., $\omega=2\pi f$); c is the speed of sound; v is a mean flow field; $\kappa$ is a scalar denoting a modified fluid bulk modulus, such as:

$$\kappa = \frac{\rho}{\rho_T^2 c^2} \quad (2)$$

where $\rho$ is the density and $\rho_T$ is the density at rest. As described, the P-G space may be characterized by coordinate stretching and variable changing, such as, but not limited to:

$$\tilde{x} = \left[I + \frac{1-\beta}{\beta}nn\right]\cdot x; \text{ and} \quad (3)$$

$$\tilde{\phi} = \phi e^{-j\frac{\omega}{c^2\beta^2}v\cdot x} = \phi e^{-j\sigma\cdot x} \quad (4)$$

in which:

$$\beta=\sqrt{1-v^2/c^2}=\sqrt{1-M^2} \quad (5)$$

M may be the Mach number. $\beta$ is 1 when the fluid is at rest.

The resulting at-rest Helmholtz expression may be, for example:

$$-\frac{\rho}{\rho_T^2 c^2}\frac{\omega^2}{\beta^2}\tilde{\phi} - \tilde{\nabla}\cdot\left(\frac{\rho}{\rho_T^2}\tilde{\nabla}\tilde{\phi}\right) = 0 \quad (6)$$

Next at block B520, the boundary condition generation module 120 may transform the at-rest Helmholtz expression into a modified PML expression. In some embodiments, coordinate stretching may be applied to transform the at-rest Helmholtz expression into a PML absorbing layer, as embodied by the modified PML expression. In particular, the modified PML expression may include complex speed of sound and complex, anisotropic second order density tensor.

For example, after PML complex stretching is introduced, the at-rest Helmholtz expression may be modified to be the modified PML expression, an example of which may be:

$$-\kappa \frac{\omega^2}{\beta^2} \tilde{\phi} - \tilde{\nabla} \cdot (\mu \cdot \tilde{\nabla} \tilde{\phi}) = 0 \qquad (7)$$

in which μ is a modified anisotropic fluid density such as:

$$\mu = \frac{\rho}{\rho_T^2} \left[ sI + \left( \frac{1}{s} - s \right) dd \right] \qquad (8)$$

where s is a complex PML stretching in direction d (where d is a normalized vector).

Next at block B530, the boundary condition generation module 120 may transform the modified PML expression into a convected PML expression using reverse P-G transformation. As described, the P-G transformation may be bijective, allowing the modified PML expression to be transformed back to its original real space, without a change in variables. The convected PML expression may include speed of sound, density, and convection mean flow that are linked to the equivalent properties of the original convected Helmholtz expression, but modified by the PML coordinate stretching. For example, density that was scalar in the original convected Helmholtz expression may be complex second order tensor in the convected PML expression. The value of the complex second order tensor may be an algebraic function of the mean flow vector and the PML stretching direction. The resulting convected PML expression may be, for example:

$$\omega^2 \kappa \left[ \frac{M^2}{\beta^2} \left( \frac{1}{s^2} - 1 \right) (d \cdot n)^2 \phi \right] + j\omega \kappa (j\omega \phi + w \cdot \nabla \phi) + \qquad (9)$$

$$\nabla \cdot (\kappa w (j\omega \phi + w \cdot \nabla \phi) - [\mu_\beta + \kappa ww] \cdot \nabla \phi) = 0$$

Where:

$$w = v + f \frac{(d \cdot n)}{\beta} [vd + (\beta - 1)(d \cdot n)v] \qquad (10)$$

$$\mu_\beta = \kappa c^2 [I + (\beta^2 - 1)nn + f(d + (\beta - 1)(d \cdot n)n)^2] \qquad (11)$$

Where $f=1/s^2-1$; n is a normalized vector, in the (local) flow direction.

While the P-G transformation may only be valid for constant mean flow, the transformation processes described with respect to block B510 and B530 are intermediate processes to arrive at the convected PML expression in the original space. There is no degradation in absorbing characteristics when the mean flow is non-constant.

Figure 6:
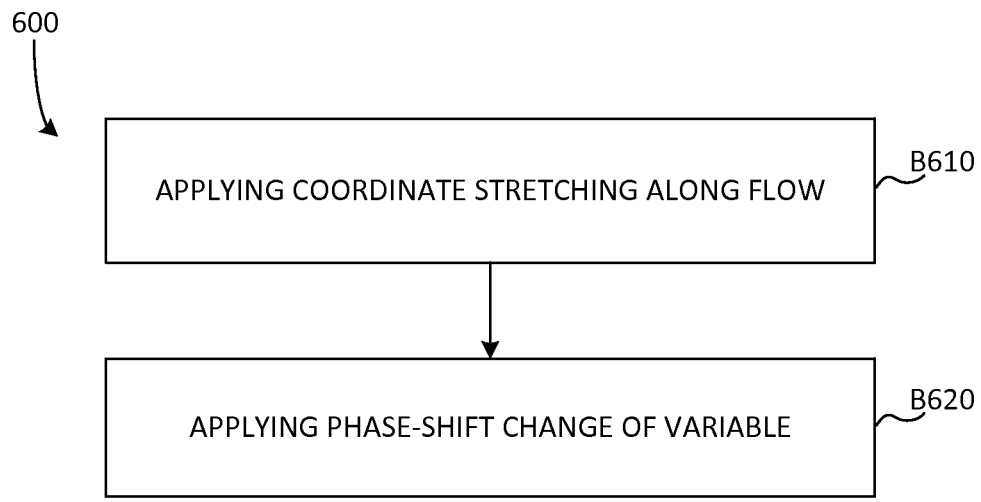
FIG. 6 is a process flowchart diagram illustrating an example of a transformation process according to various embodiments.

FIG. 6 is a process flowchart diagram illustrating an example of a transformation process 600 according to various embodiments. Referring to FIGS. 1-6, the transformation process 600 may be implemented to transform the convected Helmholtz expression into the at-rest Helmholtz expression using the P-G transformation by the boundary condition generation module 120 (as set forth in block B510).

At block B610, the boundary condition generation module 120 may apply coordinate stretching along the flow (e.g., the direction of the flow) to the convected Helmholtz expression as described. At block B620, the boundary condition generation module 120 may apply phase-shift change of variables to the convected Helmholtz expression as described. The blocks B610 and B620 may be executed sequentially in any order or simultaneously.

Figure 7:
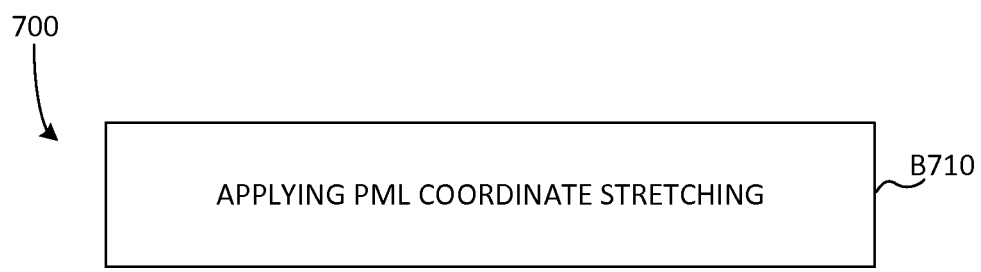
FIG. 7 is a process flowchart diagram illustrating an example of a PML transformation process according to various embodiments.

FIG. 7 is a process flowchart diagram illustrating an example of a PML transformation process 700 according to various embodiments. Referring to FIGS. 1-7, the PML transformation process 700 may be implemented to transform the at-rest Helmholtz expression into the modified PML expression by the boundary condition generation module 120 (as set forth in block B520). At block B710, the boundary condition generation module 120 may apply PML coordinate stretching to the at-rest Helmholtz expression as described to obtain the modified PML expression.

Figure 8:
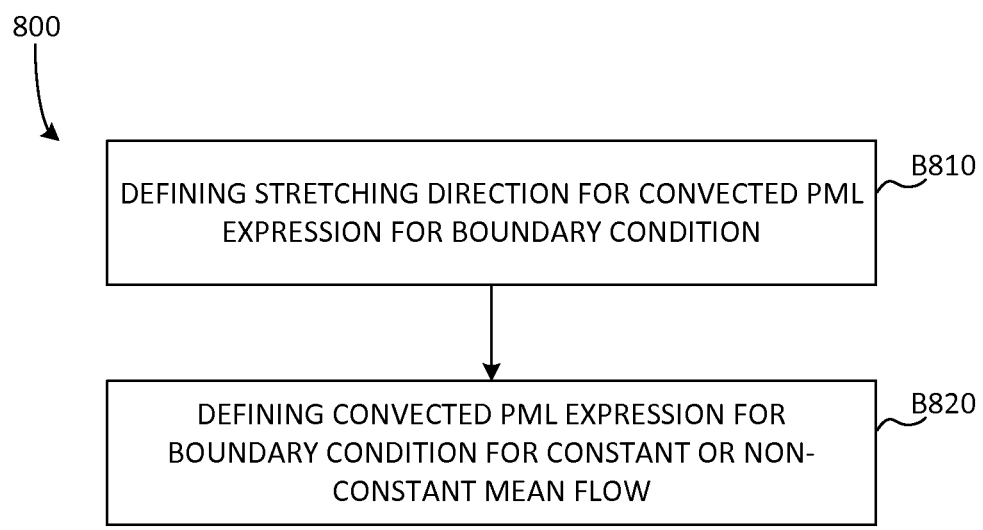
FIG. 8 is a process flow chart diagram illustrating an example of a PML layer definition process according to various embodiments.

FIG. 8 is a process flow chart diagram illustrating an example of a PML layer definition process 800 according to various embodiments. Referring to FIGS. 1-8, the PML layer definition process 800 may be implemented to provide the convected PML expression as boundary condition for at least the portion of the model (as set forth in block B220). For example, the PML layer definition process 800 may be implemented for automatic or manual definition of a PML layer (as a convected PML expression).

At block B810, the boundary condition generation module 120 may define stretching direction for convected PML expression for the boundary condition. As described, the stretching direction may be any arbitrary direction, including along the coordinate axes or otherwise. At block B820, the boundary condition generation module 120 may define the convected PML expression for the boundary condition for a constant or non-constant mean flow, in the manner described.

FIG. 9 is a schematic diagram illustrating an example of a fifth model 900 according to various embodiments. Referring to FIGS. 1-9, the fifth model 900 may be at least a portion of the model described herein, shown in a side view. The fifth model 900 may include a base component 910, as provided by the model import/export module 140. The base component 910 may be a model of a car, illustrated as a non-limiting example. The base component 910 may include at least an engine (not shown) radiating an acoustic waves 920 (e.g., due to vibration) therefrom. The engine or other portions of the base component 910 may be a vibrating body radiation source, surrounded by a mean flow (e.g., the acoustic waves 920). The direction and the intensity of the acoustic waves 920 may vary with respect to space and/or time, and may be due to the radiating body motion or an external flow source.

A PML component 930 may be generated, for example, by the boundary condition generation module 120. The boundary condition generation module 120 may automatically generate the PML component 930 based on the geometry of the base component 910. Alternatively, the boundary condition generation module 120 may receive user input via the interface 160, the user input define the geometry of the PML component 930. In either automatic or manual generation of the PML component 930, the PML component 930 may be stretched in arbitrary directions to conform with the geometry of the base component 910 which may be of an irregular shape. In some embodiments, a stretching direction of at least a portion of the PML component 930 may be in a direction of at least a portion of the acoustic waves 920. In other embodiments, a stretching direction of at least a portion of the PML component 930 may be independent (i.e., not consistent) with respect to a direction of at least a portion of the acoustic waves 920.

By allowing the PML component 930 to be defined (i.e., stretched) in arbitrary directions instead of directions consistent with coordinate axes, the PML component 930 may be defined geometrically as a tight fit to the base component 910. For example, the PML component 930 may be of an irregular shape instead of a box, rectangle, square, circle, sphere, cylinder or other shapes defined based on coordinate axes. By defining the PML component 930 to be proximal to the base component 910, the PML component 930 may be sufficient proximal to the base component 910 to be in the near field, rather in the far field, where the flow may become constant.

Referring generally to the figures, any model referred to herein may be a virtual representation of a physical object, the behavior of which may be simulated virtually to obtain a set of results usually to a user executing the simulation. The model may also be a basis of any suitable research, design, manufacturing processes in which a virtual representation of a physical object is required for practical purposes. The model may be generated and/or exported to another device/component of a device automatically or manually via the model import/export module 140, as described herein. The model import/export module 140 may be executed by the processor 106 configured to do so. The model may be simulated via the simulation module 130, which may be executed by the processor 106 configured to do so. The model may further be displayed via the interface 160. The PML regions described herein may be provided to the model via the boundary condition generation module 120. The boundary condition generation module 120 may be executed by the processor 106 configured to do so.

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions may be executed on any type of computing device (e.g., computer, laptop, etc.) or may be embedded on any type of electronic device (e.g., a portable storage device such as a flash drive, etc.).

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for generating a model of a physical object using a computer system, the model being used in a design process for manufacturing the physical object, comprising:
providing the model that is a virtual representation of the physical object, wherein the model comprises at least one of a vibrating component, an acoustic component, or a non-reflecting surface;
providing, with a processor, a convected perfectly matched layer (PML) expression as boundary condition for at least an absorbing region of the model by:

transforming a convected Helmholtz expression in the absorbing region into an at-rest Helmholtz expression for the absorbing region;

transforming the at-rest Helmholtz expression into a modified PML expression, wherein transforming the at-rest PML expression into the convected PML expression comprises applying reverse Prandtl-Glauert (P-G) transformation to at-rest PML expression for the boundary condition;

transforming the modified PML expression in into the convected PML expression for the absorbing region; and displaying, with a user interface, the model with the convected PML expression as the boundary condition for the absorbing region.

2. The method of claim 1, wherein the model is a computer-aided design (CAD) model.

3. The method of claim 1, wherein the convected Helmholtz expression is transformed into the at-rest Helmholtz expression using a bijective transformation.

4. The method of claim 1, wherein transforming the convected Helmholtz expression into the at-rest Helmholtz expression comprises applying Prandtl-Glauert (P-G) transformation to the convected Helmholtz expression for the absorbing region.

5. The method of claim 1, wherein
the convected Helmholtz expression is a first expression for a constant mean flow;
the at-rest Helmholtz expression is a second expression for a classic fluid at-rest; and
transforming the convected Helmholtz expression into the at-rest Helmholtz expression comprises transforming the first expression into the second expression using Prandtl-Glauert (P-G) transformation.

6. The method of claim 1, wherein transforming the at-rest Helmholtz expression into the PML expression comprising applying PML coordinate stretching to the at-rest Helmholtz expression for the absorbing region.

7. The method of claim 1, wherein:
providing the convected PML expression comprises defining at least one stretching direction for the convected PML expression; and
the at least one stretching direction comprises at least one of a coordinate axial direction and an arbitrary direction other than coordinate axial direction.

8. The method of claim 1, wherein providing the convected PML expression comprises defining the convected PML expression for a constant mean flow.

9. The method of claim 1, wherein providing the convected PML expression comprises defining the convected PML expression for a non-constant mean flow.

10. The method of claim 1, wherein the convected PML expression comprises a component that is defined to be proximal to the absorbing region of the model instead of being defined based on coordinate axes.

11. A system for generating a model of a physical object, the model being used in a design process for manufacturing the physical object, comprising:
a processor that executes a boundary condition generation module configured to:
provide the model that is a virtual representation of the physical object, wherein the model comprises at least one of a vibrating component, an acoustic component, or a non-reflecting surface; and
provide a convected perfectly matched layer (PML) expression as boundary condition for at least an absorbing region of the model by;

transforming a convected Helmholtz expression in the absorbing region into an at-rest Helmholtz expression for the absorbing region;

transforming the at-rest Helmholtz expression into a modified PML expression, wherein transforming the at-rest PML expression into the convected PML expression comprises applying reverse Prandtl-Glauert (P-G) transformation to at-rest PML expression for the boundary condition;

transforming the modified PML expression in into the convected PML expression for the absorbing region; at least one of a user interface configured to display the model with the convected PML expression as the boundary condition for the absorbing region.

12. The system of claim 11, wherein:
the absorbing region of the model is an absorbing region;
to provide the PML in the convected PML expression comprises:
to transform a convected Helmholtz expression in the absorbing region into an at-rest Helmholtz expression for the absorbing region;
to transform the at-rest Helmholtz expression into a modified PML expression; and
to transform the modified PML expression into the convected PML expression for the absorbing region.

13. The system of claim 11, wherein:
to provide the convected PML expression comprises to define at least one stretching direction for the convected PML expression; and
the at least one stretching direction comprises at least one of a coordinate axial direction and an arbitrary direction other than coordinate axial direction.

14. The system of claim 11, wherein to provide the convected PML expression comprises to define the convected PML expression for a non-constant mean flow.

15. A non-transitory processor readable storage media storing a program that when executed in a processor of a device causes the processor to perform a method for generating a model of a physical object using a computer system, the model being used in a design process for manufacturing the physical object, the method comprising:
providing the model that is a virtual representation of the physical object, wherein the model comprises at least one of a vibrating component, an acoustic component, or a non-reflecting surface; and
providing a convected perfectly matched layer (PML) expression as boundary condition for at least an absorbing region of the model by:
transforming a convected Helmholtz expression in the absorbing region into an at-rest Helmholtz expression for the absorbing region;
transforming the at-rest Helmholtz expression into a modified PML expression, wherein transforming the at-rest PML expression into the convected PML expression comprises applying reverse Prandtl-Glauert (P-G) transformation to at-rest PML expression for the boundary condition;
transforming the modified PML expression in into the convected PML expression for the absorbing region; and
displaying the model with the convected PML expression as the boundary condition for the absorbing region.

16. The non-transitory processor readable storage media of claim 15, wherein providing the convected PML expression comprises defining the convected PML expression for a non-constant mean flow.

* * * * *